United States Patent
Fan

(10) Patent No.: US 11,309,470 B2
(45) Date of Patent: Apr. 19, 2022

(54) ARRAY SUBSTRATE AND FABRICATION METHOD THEREOF

(71) Applicant: SHENZHEN CHINA STAR OPTOELECTRONICS SEMICONDUCTOR DISPLAY TECHNOLOGY CO., LTD., Shenzhen (CN)

(72) Inventor: Yong Fan, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 252 days.

(21) Appl. No.: 16/617,324

(22) PCT Filed: Nov. 11, 2019

(86) PCT No.: PCT/CN2019/117169
§ 371 (c)(1),
(2) Date: Nov. 26, 2019

(87) PCT Pub. No.: WO2021/051535
PCT Pub. Date: Mar. 25, 2021

(65) Prior Publication Data
US 2021/0336106 A1    Oct. 28, 2021

(30) Foreign Application Priority Data
Sep. 20, 2019  (CN) .......................... 201910892656.1

(51) Int. Cl.
 *H01L 33/62*   (2010.01)
 *H01L 27/15*   (2006.01)
 *H01L 33/38*   (2010.01)

(52) U.S. Cl.
 CPC ............ *H01L 33/62* (2013.01); *H01L 27/156* (2013.01); *H01L 33/38* (2013.01); *H01L 2933/0066* (2013.01)

(58) Field of Classification Search
 CPC ....... H01L 33/62; H01L 27/156; H01L 33/38; H01L 2933/0066
 See application file for complete search history.

(56) References Cited

U.S. PATENT DOCUMENTS 10,388,825 B2 *  8/2019  Lin ..................... H01L 25/0753
2015/0197672 A1  7/2015  Namiki et al.
(Continued)

FOREIGN PATENT DOCUMENTS

CN  203644815 U  6/2014
CN  104520398 A  4/2015
(Continued)

*Primary Examiner* — Victor A Mandala
(74) *Attorney, Agent, or Firm* — Osha Bergman Watanabe & Burton LLP

(57) ABSTRACT

An array substrate and a method of fabricating the array substrate are disclosed. The array substrate includes a substrate including a plurality of pixel units arranged in an array. Each of the pixel units has a first electrode and a second electrode, and a first gap is provided between the first electrode and the second electrode. A bonding adhesive is disposed at the first gap. A micro light-emitting diode is disposed on the first electrode, the second electrode, and the bonding adhesive to prevent a failure of the micro light-emitting diode and improve product yield.

7 Claims, 4 Drawing Sheets

(56) References Cited

U.S. PATENT DOCUMENTS

| | | | | |
|---|---|---|---|---|
| 2015/0295142 | A1* | 10/2015 | Huang | H01L 33/62 |
| | | | | 438/26 |
| 2015/0318444 | A1* | 11/2015 | Huang | H01L 33/385 |
| | | | | 438/28 |
| 2016/0079483 | A1* | 3/2016 | Obata | H01L 33/486 |
| | | | | 257/91 |
| 2016/0163940 | A1* | 6/2016 | Huang | H01L 25/0756 |
| | | | | 257/89 |
| 2016/0322539 | A1 | 11/2016 | Zhang et al. | |
| 2017/0062674 | A1* | 3/2017 | Kwon | H01L 33/60 |
| 2017/0256522 | A1* | 9/2017 | Cok | H01L 25/0753 |
| 2019/0088837 | A1 | 3/2019 | Lee et al. | |
| 2019/0131281 | A1* | 5/2019 | Liu | H01L 33/38 |
| 2019/0131282 | A1* | 5/2019 | Liu | H01L 24/81 |
| 2019/0181122 | A1 | 6/2019 | Hsu et al. | |
| 2019/0181317 | A1 | 6/2019 | Yu et al. | |
| 2019/0334066 | A1 | 10/2019 | Lim et al. | |
| 2020/0295120 | A1* | 9/2020 | Bower | H01L 27/3293 |
| 2021/0119098 | A1* | 4/2021 | Kajiyama | H01L 24/05 |
| 2021/0135042 | A1* | 5/2021 | Wei | H01L 33/005 |

FOREIGN PATENT DOCUMENTS

| | | | | |
|---|---|---|---|---|
| CN | 104993041 | * | 10/2015 | 33/62 |
| CN | 108336077 | A | 7/2018 | |
| CN | 109429532 | A | 3/2019 | |
| CN | 109728022 | A | 5/2019 | |
| CN | 109791966 | A | 5/2019 | |
| CN | 110047866 | A | 7/2019 | |
| TW | 201919224 | A | 5/2019 | |

\* cited by examiner

ARRAY SUBSTRATE AND FABRICATION METHOD THEREOF

BACKGROUND OF INVENTION

1. Field of Invention

The present invention relates to a technical field of displays, and particularly to, an array substrate and a fabrication method thereof.

2. Related Art

In recent years, micro light-emitting diode (LED) displays have high reliability, high color gamuts, high brightness, high transparency, and high pixels per inch (PPI) in comparison with organic light-emitting diodes (OLEDs), and also have low requirements for encapsulation, and therefore are easier to achieve flexible and seamless splicing display. For this reason, the micro LED displays are becoming displays having most potential in future development.

In related art, micro LEDs are divided into a vertical type structure and a flip-chip type structure, wherein the flip-chip type structure micro LEDs do not require an electrode process to realize electrical connection with an array substrate after transferring and bonding, and are further simplified in later processes. However, since an electrode area of the flip-chip type micro LEDs is small, an adhesion force to the array substrate after bonding is small, resulting in a higher risk of failure under conditions, such as high temperatures, high humidity, or thermal shock. Besides, due to an increase in a one-time transferring area of the micro LEDs, thermal expansion caused by heating during bonding is increasing, thereby limiting accuracy of bonding.

Therefore, it is imperative to overcome drawbacks existing in prior art.

SUMMARY OF INVENTION

An embodiment of the present application provides an array substrate and a fabrication method thereof to increase a contact area between a micro light-emitting diode and an array substrate, thereby improving product yield.

In a first aspect, an embodiment of the present application provides an array substrate, comprising a substrate comprising a plurality of pixel units arranged in an array, wherein each of the pixel units comprises a first electrode and a second electrode, and a first gap is provided between the first electrode and the second electrode; a bonding adhesive disposed at the first gap; and a micro light-emitting diode (LED) disposed on the first electrode, the second electrode, and the bonding adhesive.

In the array substrate of the present application, the micro LED comprises a positive electrode, a negative electrode, and a micro LED body, wherein the positive electrode is disposed on the first electrode, and the negative electrode is disposed on the second electrode.

In the array substrate of the present application, at least a first solder material is further disposed between the positive electrode and the first electrode, and at least a second solder material is further disposed between the negative electrode and the second electrode.

In the array substrate of the present application, a melting temperature of each of the first solder material and the second solder material is greater than a freezing point temperature of the bonding adhesive.

In the array substrate of the present application, the bonding adhesive has a horizontal width equal to that of the first gap.

In the array substrate of the present application, the bonding adhesive has a thickness between 0.5 microns to 5 microns.

In the array substrate of the present application, the bonding adhesive has a freezing point temperature between 100° C. to 250° C.

In the array substrate of the present application, the bonding adhesive is composed of one of epoxy, silica gel, polyurethane, and polyacrylic compound.

In the array substrate of the present application, the array substrate further comprises a data line, a sensing line, a first thin-film transistor, a second thin-film transistor, a third thin-film transistor, and a capacitor.

In a second aspect, an embodiment of the present application further provides a method of fabricating an array substrate, comprising providing a substrate, wherein the substrate comprises a plurality of pixel units arranged in an array, each of the pixel units comprises a first electrode and a second electrode, and a first gap is provided between the first electrode and the second electrode; applying a bonding adhesive to each of the first gaps; transferring a micro light-emitting diode (LED) onto the first electrode and the second electrode; and curing the bonding adhesive so that the micro LED is connected to the substrate through the bonding adhesive.

In the method of fabricating the array substrate, the transferring a micro LED onto the first electrode and the second electrode comprises electrically connecting a positive electrode of the micro LED to the first electrode, and electrically connecting a negative electrode of the micro LED to the second electrode.

In a third aspect, an embodiment of the present application further provides an array substrate, comprising a substrate comprising a plurality of pixel units arranged in an array, wherein each of the pixel units comprises a first electrode and a second electrode, and a first gap is provided between the first electrode and the second electrode; a bonding adhesive disposed at the first gap; and a micro light-emitting diode disposed on the first electrode, the second electrode, and the bonding adhesive, wherein the micro light-emitting diode comprises a positive electrode, a negative electrode, and a micro light-emitting diode body, wherein the positive electrode is disposed on the first electrode, the negative electrode is disposed on the second electrode, and the bonding adhesive has a horizontal width equal to that of the first gap.

An embodiment of the present application provides an array substrate, including a substrate having a plurality of pixel units arranged in an array, wherein each of the pixel units includes a first electrode and a second electrode, and a first gap is provided between the first electrode and the second electrode; a bonding adhesive disposed at the first gap; and a micro light-emitting diode disposed on the first electrode, the second electrode, and the bonding adhesive. In this manner, a contact area between the micro light-emitting diode and the array substrate can be increased, thereby preventing a risk of failure of the micro light-emitting diode under conditions, such as high temperatures, high humidity, or thermal shock, and therefore improving product yield.

BRIEF DESCRIPTION OF DRAWINGS

To better illustrate embodiments or technical solutions in the prior art, a brief description of the drawings used in the embodiments or the prior art description will be given below. Obviously, the accompanying drawings in the following description merely show some embodiments of the present invention, and a person skilled in the art may still derive other drawings from these accompanying drawings without creative efforts.

DESCRIPTION OF PREFERRED EMBODIMENTS

The technical solutions in the embodiments of the present application will be clearly and completely described in the following with reference to the accompanying drawings in the embodiments. It is apparent that the described embodiments are only a part of the embodiments of the present application, and not all of them. All other embodiments obtained by a person skilled in the art based on the embodiments of the present application without creative efforts are within the scope of the present application.

Figure 1:
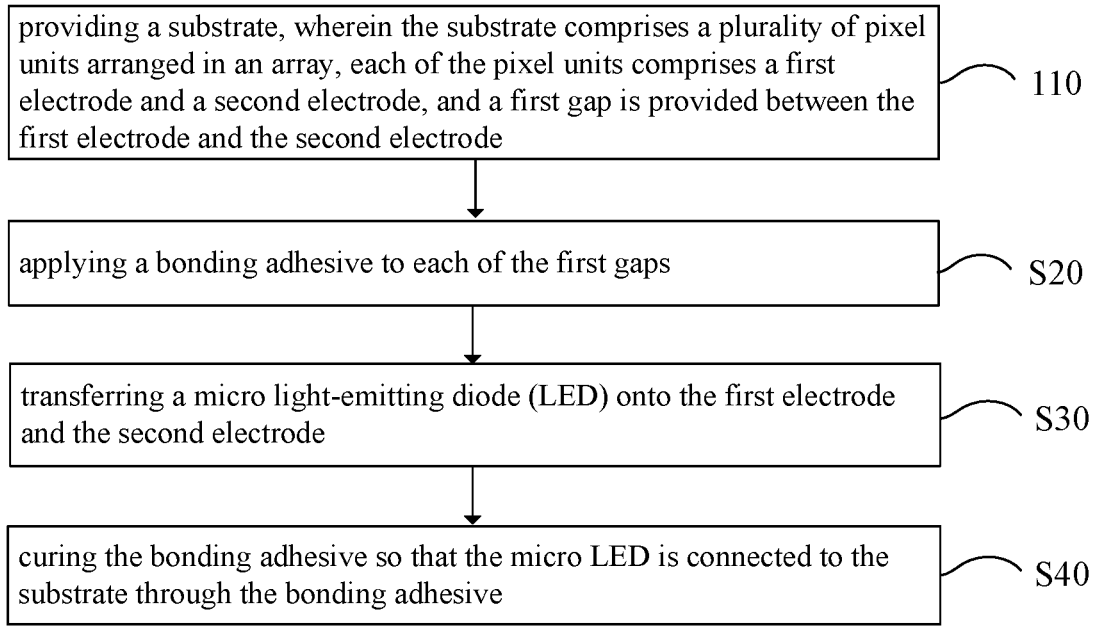
FIG. 1. is a first flowchart of a method of fabricating an array substrate of an embodiment of the present application.

Please refer to FIG. 1. FIG. 1 is a first flowchart of a method of fabricating an array substrate 100 of an embodiment of the present application. The method includes:

Step 110: providing a substrate 10, wherein the substrate 10 includes a plurality of pixel units 20 arranged in an array, each of the pixel units 20 includes a first electrode 201 and a second electrode 202, and a first gap W1 is provided between the first electrode 201 and the second electrode 202.

Figure 2:
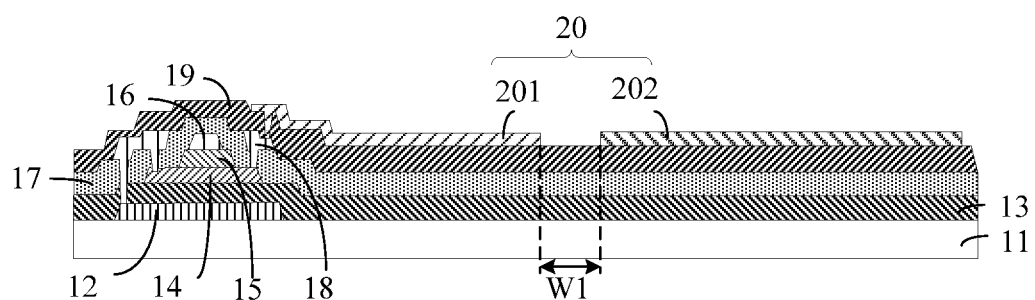
FIG. 2 is a view of a first intermediate product of an array substrate of an embodiment of the present application.

Specifically, as shown in FIG. 2, FIG. 2 is a view of a first intermediate product of the array substrate 100 of an embodiment of the present application. The array substrate 100 includes the substrate 10 and a first metal layer 12, a first insulting layer 13, an active layer 14, a gate insulting layer 15, a gate electrode 16, a second insulating layer 17, a source/drain electrode 18, a planarization layer 19, and a pixel electrode 20.

The pixel electrode 20 includes the first electrode 201 and the second electrode 202, and the first gap W1 is provided between the first electrode 201 and the second electrode 202.

Figure 3:
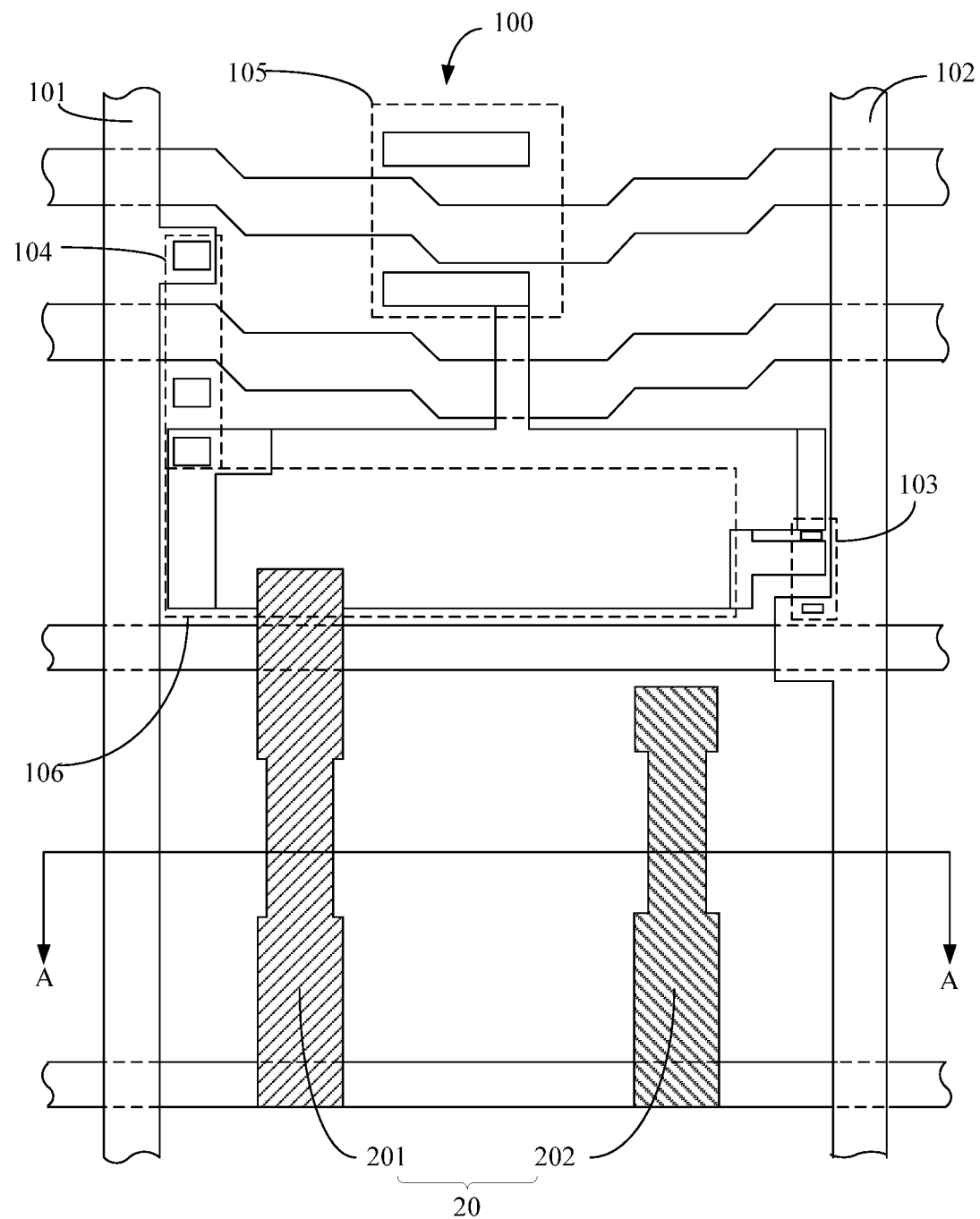
FIG. 3 is a view of a second intermediate product of an array substrate of an embodiment of the present application.

Specifically, please refer to FIG. 3. FIG. 3 is a view of a second intermediate product of the array substrate 100 of an embodiment of the present application. FIG. 3 is a top plan view of the array substrate 100 of FIG. 2. Taking a 3T1C circuit as an example, the array substrate 100 includes a data line 101, a sensing line 102, a first thin-film transistor (T1) 103, a second thin-film transistor (T2) 104, a third thin-film transistor (T3) 105, and a capacitor (Cs) 106. The pixel electrode 20 is disposed below the 3T1C circuit.

Specifically, the substrate 10 is generally a thin-film transistor (TFT) backplate composed of a polymer material such as polydimethylsiloxane (PDMS), and has a high thermal expansion coefficient, and is inert. The first electrode 201 and the second electrode 202 are generally transparent pixel electrodes on the TFT backplate.

Step 120: applying a bonding adhesive solution 30 to each of the first gaps W1.

Figure 4:
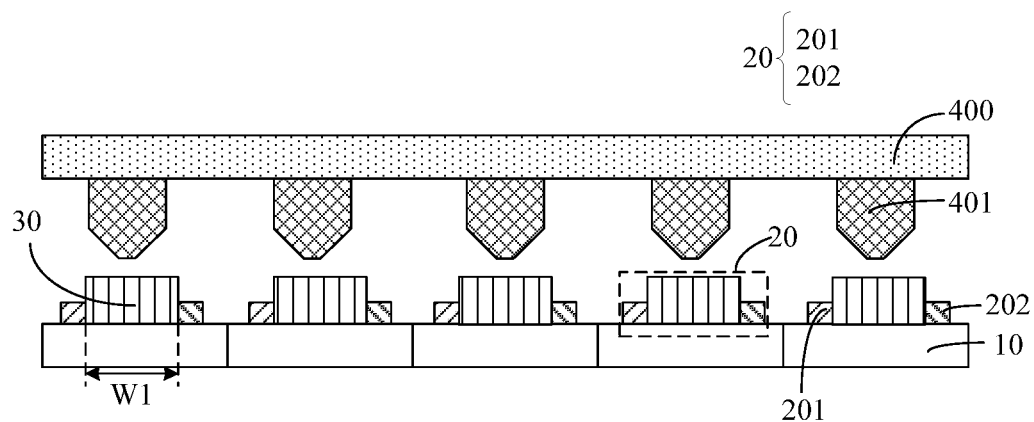
FIG. 4 is a view of a third intermediate product of an array substrate of an embodiment of the present application.

Please refer to FIG. 4 for details about the aforementioned step. FIG. 4 is a view of a third intermediate product of the array substrate 100 of an embodiment of the present application. FIG. 4 is a cross-sectional view taken along line A-A in the array substrate 100 of FIG. 3. It can be seen that the bonding adhesive solution 30 is dripped into each of the first gaps W1 between the first electrodes 201 and the second electrodes 202 through a first carrier plate 400 provided with a plurality of rising dispensing heads 401. The bonding adhesive solution 30 has a freezing point temperature between 100° C. to 250° C., and the bonding adhesive solution 30 is composed of one of epoxy, silica gel, polyurethane, and polyacrylic compound.

A pitch between adjacent two of the dispensing heads 401 is equal to a sum of a pitch between adjacent two of the pixel electrodes 20 and a width between the first electrode 201 and the second electrode 202 to ensure that each of the dispensing heads 401 of the first carrier plate 400 is aligned with a corresponding one of the first gaps W1.

Alternatively, the bonding adhesive 30 may be dripped by only one dispensing head 401 to each of the first gaps W1. A manner to apply the bonding adhesive 30 here is not limited to dripping, but may be coating or other means, which is not limited herein.

Step 130: transferring a micro light-emitting diode (LED) 40 onto the first electrode 201 and the second electrode 202.

Figure 5:
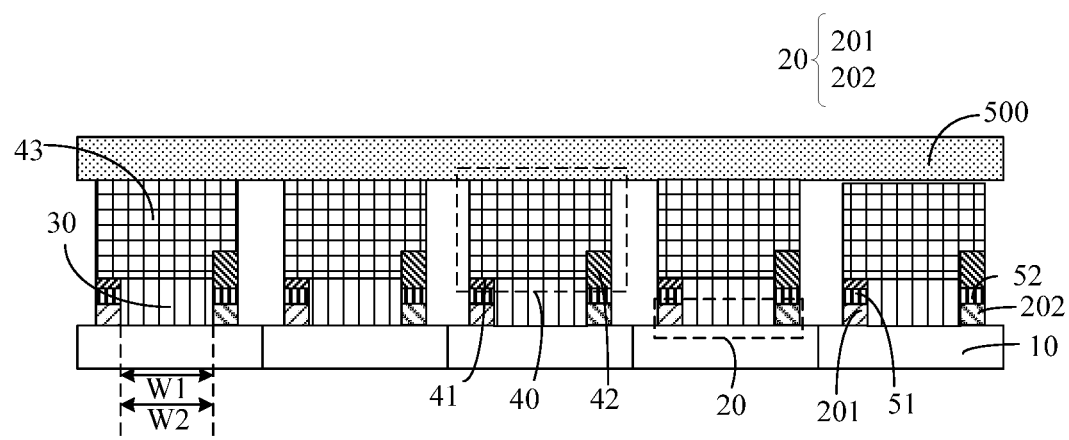
FIG. 5 is a view of a fourth intermediate product of an array substrate of an embodiment of the present application.

Specifically, as shown in FIG. 5, FIG. 5 is a view of a fourth intermediate product of the array substrate 100 of an embodiment of the present application.

A plurality of micro LEDs 40 are carried by a second carrier plate 500 to be transferred onto the first electrodes 201 and the second electrodes 202. It can be seen that in the plurality of micro LEDs 40 transferred by the second carrier plate 500, each of the micro LEDs 40 is disposed on a corresponding set of the electrodes 20.

Specifically, each of the micro LEDs 40 includes a positive electrode 41, a negative electrode 42, and a micro LED body 42. The positive electrode 41 is disposed on the first electrode 201, and the negative electrode 42 is disposed on the second electrode 402. Therefore, the step of transferring the micro LEDs 40 onto the first electrodes 201 and the second electrodes 202 includes: electrically connecting the positive electrode 41 of each of the micro LEDs 40 to the corresponding first electrode 201, and electrically connecting the negative electrode 42 of each of the micro LEDs 40 to the corresponding second electrode 202.

A specific manner of soldering is performed by using at least a first solder material 51 disposed between the positive electrode 201 and the first electrode 202, and at least a second solder material 52 disposed between the negative electrode 42 and the second electrode 202. The first solder material 51 and the second solder material 52 may be disposed on the first electrode 201 and the second electrode 202, respectively, after the first electrode 20 the second electrode 202 are formed, wherein each of the first solder material 51 and the second solder material 52 is made of an electrically conductive material.

A melting temperature of each of the first solder material and the second solder material is greater than a freezing point temperature of the bonding adhesive 30.

Step 140: curing the bonding adhesive solution 30 so that each of the micro LEDs 40 is connected to the substrate 10 through the bonding adhesive.

Specifically, a manner of curing the bonding adhesive solution 30 includes, but not limited to, performing a high temperature curing treatment on an adhesive solution 30 being dripped, so that the bonding adhesive solution 30 is formed into the bonding adhesive of a solid form.

The solid bonding adhesive has a thickness between 0.5 microns and 5 microns, and the bonding adhesive has a horizontal width W2 equal to a horizontal width of the first gap W1.

Figure 6:
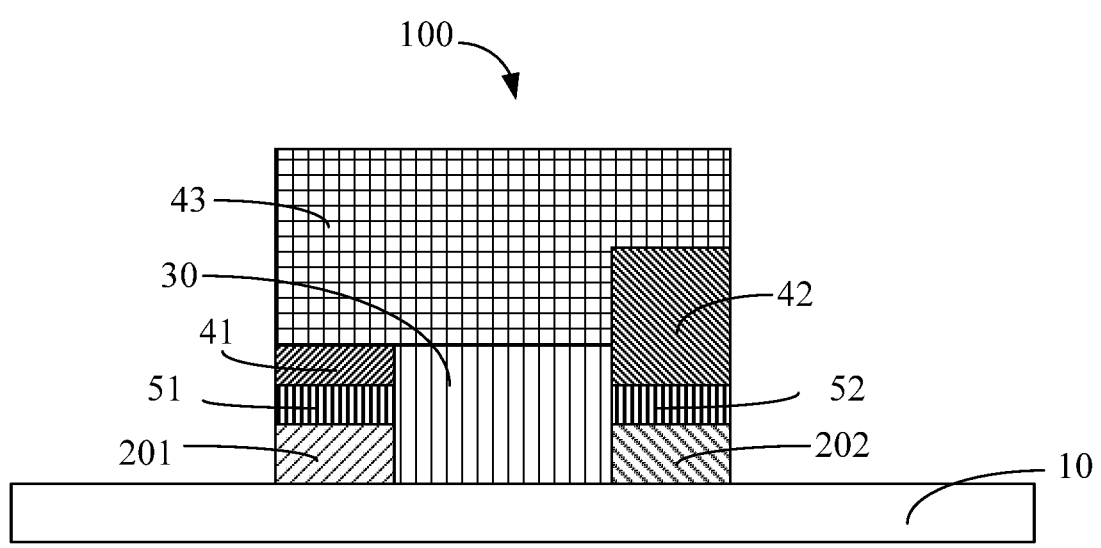
FIG. 6 is a schematic structural view of an array substrate of an embodiment of the present application.

Please refer to FIG. 6. FIG. 6 is a schematic structural view of an array substrate 100 of an embodiment of the present application. FIG. 5 is an enlarged view of FIG. 4. The array substrate 100 fabricated by the method as described above includes an array substrate 10, including a plurality of pixel units 20 arranged in an array, wherein each of the pixel units 20 includes a first electrode 201 and a second electrode 202, and a first gap W1 is provided between the first electrode 201 and the second electrode 202; a bonding adhesive disposed at the first gap W; and a micro light-emitting diode 40 disposed on the first electrode 201, the second electrode 202, and the bonding adhesive.

An embodiment of the present application further provides an array substrate, including a substrate including a plurality of pixel units arranged in an array, wherein each of the pixel units includes a first electrode and a second electrode, and a first gap is provided between the first electrode and the second electrode; a bonding adhesive disposed at the first gap; and a micro light-emitting diode disposed on the first electrode, the second electrode, and the bonding adhesive, wherein the micro light-emitting diode includes a positive electrode, a negative electrode, and a micro light-emitting diode body, wherein the positive electrode is disposed on the first electrode, the negative electrode is disposed on the second electrode, and the bonding adhesive has a horizontal width equal to that of the first gap.

An embodiment of the present application provides an array substrate, including a substrate having a plurality of pixel units arranged in an array, wherein each of the pixel units includes a first electrode and a second electrode, and a first gap is provided between the first electrode and the second electrode; a bonding adhesive disposed at the first gap; and a micro light-emitting diode disposed on the first electrode, the second electrode, and the bonding adhesive. In this manner, a contact area between the micro light-emitting diode and the array substrate can be increased, thereby preventing a risk of failure of the micro light-emitting diode under conditions, such as high temperatures, high humidity, or thermal shock, and therefore improving product yield.

In the above embodiments, the descriptions of the various embodiments are different, and the details that are not described in a certain embodiment can be referred to the related descriptions of other embodiments.

The method of fabricating an array substrate and an array substrate provided by the embodiments of the present application are described in detail in the above content. The principles and implementations of the present application are described in the specific embodiments as stated above. The description of the above embodiments is only to help understand the technical solutions and core ideas of the present application. It should be understood by those skilled in the art that the technical solutions described in the aforementioned embodiments may be modified, or some of the technical features may be equivalently replaced; and the modifications or replacements do not make the essence of the corresponding technical solutions deviate from the scope of the technical solutions of the embodiments of the present application.

What is claimed is:

1. An array substrate, comprising:
   a substrate comprising a plurality of pixel units arranged in an array, wherein each of the pixel units comprises a first electrode and a second electrode, and a first gap is provided between the first electrode and the second electrode;
   a bonding adhesive disposed at the first gap; and
   a micro light-emitting diode (LED) disposed on the first electrode, the second electrode, and the bonding adhesive and comprising a positive electrode, a negative electrode, and a micro LED body, wherein the positive electrode is disposed on the first electrode and the negative electrode is disposed on the second electrode;
   wherein at least a first solder material is further disposed between the positive electrode and the first electrode, and at least a second solder material is further disposed between the negative electrode and the second electrode.

2. The array substrate of claim 1, wherein a melting temperature of each of the first solder material and the second solder material is greater than a freezing point temperature of the bonding adhesive.

3. The array substrate of claim 1, wherein the bonding adhesive has a horizontal width equal to that of the first gap.

4. The array substrate of claim 3, wherein the bonding adhesive has a thickness between 0.5 microns to 5 microns.

5. The array substrate of claim 4, wherein the bonding adhesive has a freezing point temperature between 100° C. to 250° C.

6. The array substrate of claim 5, wherein the bonding adhesive is composed of one of epoxy, silica gel, polyurethane, and polyacrylic compound.

7. The array substrate of claim 1, wherein the array substrate further comprises a data line, a sensing line, a first thin-film transistor, a second thin-film transistor, a third thin-film transistor, and a capacitor.

* * * * *